United States Patent

Verhaeghe et al.

[11] Patent Number: 5,592,410
[45] Date of Patent: Jan. 7, 1997

[54] CIRCUIT AND METHOD FOR REDUCING A COMPENSATION OF A FERROELECTRIC CAPACITOR BY MULTIPLE PULSING OF THE PLATE LINE FOLLOWING A WRITE OPERATION

[75] Inventors: Donald J. Verhaeghe; Steven D. Traynor, both of Colorado Springs, Colo.

[73] Assignee: Ramtron International Corporation, Colorado Springs, Colo.

[21] Appl. No.: 420,293

[22] Filed: Apr. 10, 1995

[51] Int. Cl.$^6$ .................................................. G11C 11/22
[52] U.S. Cl. ........................................ 365/145; 365/189.01
[58] Field of Search ...................................... 365/145, 149, 365/189.01

[56] References Cited

U.S. PATENT DOCUMENTS

| | | | |
|---|---|---|---|
| 4,893,272 | 1/1990 | Eaton, Jr. | 365/145 |
| 5,270,967 | 12/1993 | Moazzami et al. | 365/145 |
| 5,381,364 | 1/1995 | Chern | 365/145 |
| 5,530,668 | 6/1996 | Chern | 365/145 |

OTHER PUBLICATIONS

Ramtron International Corporation, "Ramtron FM24C16 FRAM® Serial Memory, Product Review," Colorado Springs, CO., 1994, brochure pp. 1–8.
Ramtron International Corporation, "Ramtron FRAM® Technology," Colorado Springs, CO., brochure pp. 1 and 2.

*Primary Examiner*—David C. Nelms
*Assistant Examiner*—Son Mai
*Attorney, Agent, or Firm*—William J. Kubida; Peter J. Meza

[57] ABSTRACT

A circuit and method for reducing compensation of a ferroelectric capacitor in a cell of a memory array allows the capacitor's hysteresis loop to be repositioned toward its uncompensated position by pulsing the electrodes of the memory cell capacitors, via the memory array plate line, one or more additional times whenever a "write" occurs to the memory array. As a result, the ferroelectric capacitor delivers a signal of greater strength to the memory device sense amps upon a subsequent "read" operation significantly enhancing overall reliability and yield yet without reducing overall device endurance.

9 Claims, 10 Drawing Sheets

CIRCUIT AND METHOD FOR REDUCING A COMPENSATION OF A FERROELECTRIC CAPACITOR BY MULTIPLE PULSING OF THE PLATE LINE FOLLOWING A WRITE OPERATION

BACKGROUND OF THE INVENTION

The present invention relates, in general, to the field of ferroelectric random access memory devices. More particularly, the present invention relates to a circuit and method for reducing compensation of a ferroelectric capacitor through multiple plate line pulsing following a "write" operation.

Ferroelectric memory devices, such as the FRAM® family of solid state, random access memory ("RAM") integrated circuits ("ICs") available from Ramtron International Corporation, Colorado Springs, Colo. provide non-volatile data storage through the use of a ferroelectric dielectric material which may be polarized in one direction or another in order to store a binary value. The ferroelectric effect allows for the retention of a stable polarization in the absence of an applied electric field due to the alignment of internal dipoles within the Perovskite crystals in the dielectric material. This alignment may be selectively achieved by application of an electric field which exceeds the coercive field of the material. Conversely, reversal of the applied field reverses the internal dipoles.

A hysteresis curve, wherein the abscissa and ordinate represent the applied voltage and resulting polarization states respectively, may be plotted to represent the response of the polarization of a ferroelectric capacitor to the applied voltage as shown in the solid curve 11 of the attached FIG. 1. A more complete description of this characteristic hysteresis curve is disclosed, for example, in U.S. Pat. Nos. 4,914,627 and 4,888,733 assigned to the assignee of the present invention, the disclosures of which are herein specifically incorporated by this reference.

Data stored in a ferroelectric memory cell is "read" by applying an electric field to the cell capacitor. If the field is applied in a direction to switch the internal dipoles, more charge will be moved than if the dipoles are not reversed. As a result, sense amplifiers can measure the charge applied to the cell bit lines and produce either a logic "1" or "0" at the IC output pins. In a conventional two transistor/two capacitor ("2T/2C") ferroelectric memory cell, a pair of two data storage elements are utilized, each polarized in opposite directions. To "read" the state of a 2T/2C memory cell, both elements are polarized in the same direction and the sense amps measure the difference between the amount of charge transferred from the cells to a pair of complementary bit lines. In either case, since a "read" to a ferroelectric memory is a destructive operation, the correct data is then restored to the cell during a precharge operation.

In a simple "write" operation, an electric field is applied to the cell capacitor to polarize it to the desired state. Briefly, the conventional write mechanism for a 2T/2C memory cell includes inverting the dipoles on one cell capacitor and holding the electrode, or plate, to a positive potential greater than the coercive voltage shown in FIG. 1 for a nominal 100 nanosecond ("nsec.") time period. The electrode is then brought back to circuit ground for the other cell capacitor to be written for an additional nominal 100 nsec. However, since ferroelectric capacitors tend to become "compensated", (as shown by the dashed curve 13 of FIG. 1, wherein the hysteresis loop appears to shift to favor the stored state due to a charge build-up), such compensation can result in a much lower signal to be presented to the sense amps upon the performance of subsequent "read" operations, thereby possibly indicating a device failure during test.

SUMMARY OF THE INVENTION

The circuit and method of the present invention allows the hysteresis loop to be repositioned toward its uncompensated position by pulsing the electrodes of the memory cell capacitors, via the memory array plate line, one or more additional times whenever a "write" occurs to the array. In so doing, the ferroelectric capacitors deliver a signal of greater strength to the sense amps upon a subsequent "read" operation. Moreover, since the plate line is pulsed without changing data, no fatigue cycles occur which otherwise tend to reduce the overall read operation endurance of the IC. A significant yield improvement has been observed utilizing the compensation reducing technique herein disclosed.

The multiple plate pulsing circuit and method of the present invention brings the memory cell capacitor electrode, or plate, which is coupled to the plate line, back "high" following a "write" operation to further reinforce the newly written opposite data. This may be done, for example, for a nominal 100 nsec. although other pulse widths and repetition rates may be utilized. In a particular embodiment described herein, this additional plate pulsing may occur from one to eight times utilizing pulses of between 25–300 nsec. with a similar spacing between pulses depending on the mask programming of the IC. Following the programmed number of additional plate pulses, the precharge operations of the IC may continue in a conventional manner.

Broadly, what is disclosed is a circuit and method for reducing compensation of a ferroelectric capacitor by multiple pulsing of the electrodes following a "write" operation. In accordance with the present invention, a ferroelectric memory device is disclosed comprising an array of memory cells each for maintaining at least one of a first or second dipole representative of an individual data bit therein. The memory cells are capable of being selectively coupled between a bit line and a plate line. The memory device includes at least one ferroelectric capacitor having first and second terminals thereof, with the ferroelectric capacitor being associated with each of the memory cells for maintaining a stored state of the first or second dipole therein. The first terminal of the capacitor is coupled to the plate line. At least one transistor having first, second and control terminals thereof is provided, with the first and second terminals of the transistor being coupled to the bit line and the second terminal of the capacitor respectively. The control terminal is coupled to a word line for selectively activating the transistor to couple the capacitor between the bit and plate lines. A multiple plate pulsing section is provided for reinforcing the stored state of the dipole by selectively applying a reinforcing potential to the plate line in a direction of the dipole one or more times following an opposite state "write" operation.

In accordance with a method of the present invention, there is disclosed a process for writing data to a ferroelectric memory cell comprising at least one ferroelectric capacitor having a predetermined stored dipole state maintained therein and a series connected transistor selectively coupled between a plate line and a bit line in response to a word line coupled to a control terminal of the transistor. The process comprises the steps of firstly applying a potential to the word line to enable the transistor and secondly applying a first potential to the plate line to place an opposite stored dipole state in the capacitor. The process further comprises the steps of then thirdly removing the first potential from the plate line and fourthly applying a potential to the bit line to return the opposite stored dipole state to the predetermined stored dipole state in the capacitor. The process continues by fifthly reapplying the first potential to the plate line, sixthly removing the potential from the bit line to again place the opposite stored dipole state in the capacitor and seventhly removing the first potential from the plate line completing a conventional "write" operation. The process of the present invention then includes the steps of eighthly again reapplying the first potential to the plate line and ninthly again removing the first potential from the plate line for a predetermined number of times. The process concludes by tenthly returning the bit line and the word line to an initial condition thereof.

BRIEF DESCRIPTION OF THE DRAWINGS

The foregoing and other features and objects of the present invention and the manner of attaining them will be best understood by reference to the following description of a preferred embodiment taken in conjunction with the accompanying drawings, wherein.

DESCRIPTION OF A PREFERRED EMBODIMENT

Figure 2:
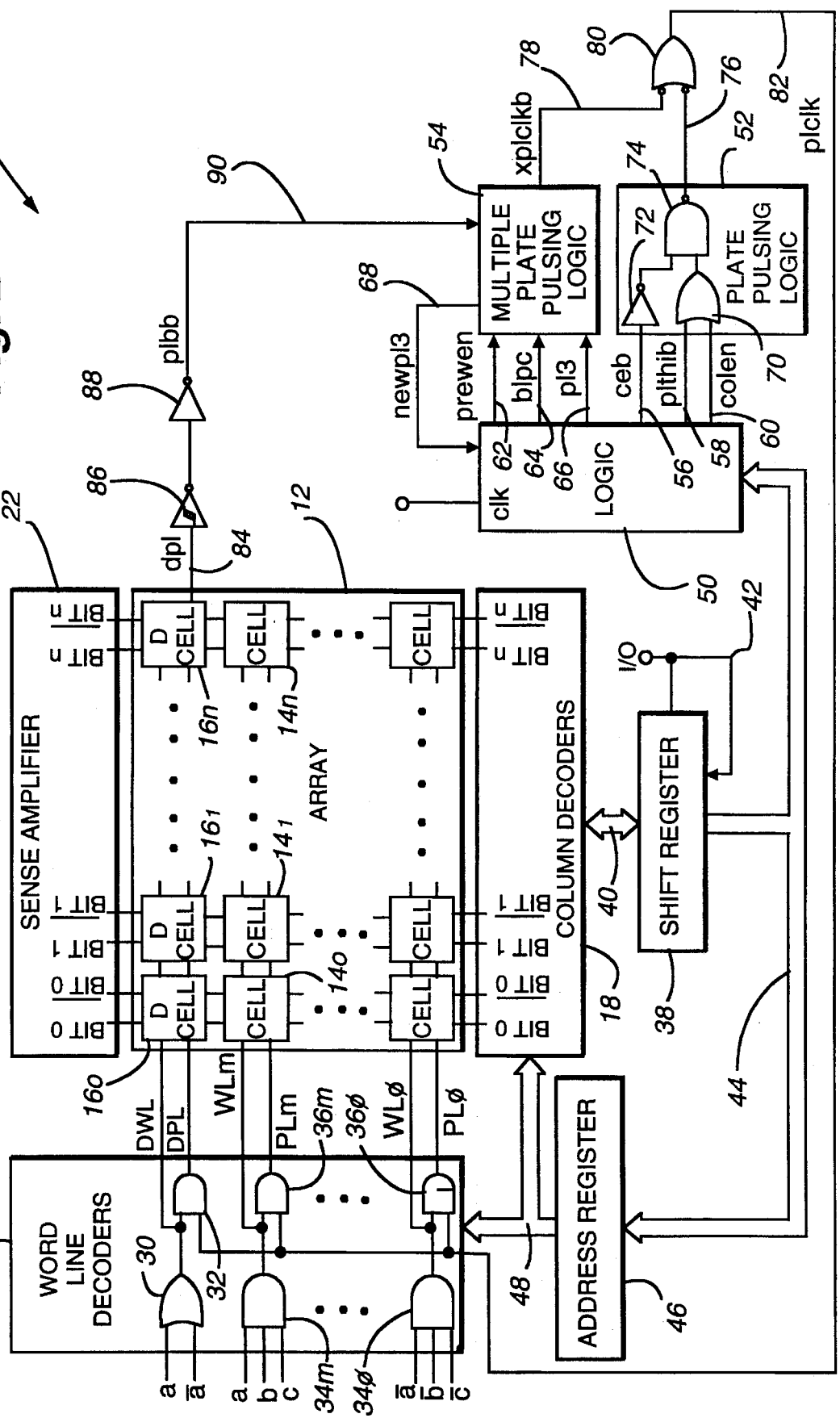
FIG. 2 is a partial block, partial logic device level diagram of a serial ferroelectric memory device integrated circuit as an exemplary implementation of the circuit and method of the present invention for reducing compensation of a ferroelectric capacitor by multiple pulsing of the electrodes following a "write" operation.

With reference now to FIG. 2, a ferroelectric random access memory ("FRAM®") memory device 10 is shown. The memory device 10 comprises, in pertinent part, a memory array 12 including a plurality of two transistor/two capacitor ("2T/2C") cells $14_0$–$14_n$ arranged in a matrix having a number of rows and columns therein defining the memory size and dimensions of the memory device 10. The array 12 also includes a number of dummy cells $16_0$–$16_n$ (which are described hereinafter in greater detail with respect to FIG. 3A) laid out between the cells 14 and the memory device 10 sense amplifiers 22 but have no electrical connection to the complementary bit lines. Addressing of the array 12 is accomplished in a conventional manner by means of a number of column decoders 18 and word line decoders 20 as shown. The sense amplifiers 22 are coupled to the various bit lines (bit 0, bit 0\, bit 1, bit 1\ . . . bit n, bit n\) as are the column decoders 18. The bit lines are the data lines for the array 12 where the data from the memory cells 14 appears during an access. Utilizing a 2T/2C cell structure as shown, there is a true (bit) and complement (bit\) line for each cell 14. The word line decoders 20 are coupled to the array 12 on the various word lines ($WL_0$ . . . $WL_m$) and plate lines ($PL_0$–$PL_m$) as well as to dummy cells $16_0$–$16_n$ on dummy word line ("DWL") and dummy plate line ("DPL") as shown. The dummy word line signal "DWL" and dummy plate line "DPL" signals activate every access cycle to provide timing information to the control logic 50 (as will be more fully described hereinafter) and mimic the real selected word and plate line signals respectively.

The word line decoders 20 comprise an OR gate 30 having as inputs a signal "a" and "a\". The output of OR gate 30 is applied as one input to AND gate 32 as well as to the dummy word line "DWL" for input to the dummy cells $16_0$–$16_n$. An additional input to AND gate 32 is supplied on plclk line 82 as will be more fully described hereinafter. The word line decoders 20 further comprise a number of multiple input AND gates $34_0$–$34_m$ having as inputs the signals "a", "b", and "c" as well as the complementary signals "a\", "b\", and "c\" (and the various permutations thereof) in order to select the appropriate word lines of the various cells $14_0$–$14_n$ of the array 12. The signals "a", "b", "c" and the complementary signals "a\", "b\" and "c\" are the first-stage-decoded address signals which feed the word line decoders 20 to decode a unique word line $WL_0$–$WL_m$ and only one word line will be active for any given memory access. The outputs of the various AND gates $34_0$–$34_m$ form the various word line signals $WL_0$–$WL_m$ and are supplied as one input to a series of AND gates $36_0$–$36_m$ having as an additional input the "plclk" signal as will be more fully described hereinafter. The outputs of the various AND gates $36_0$–$36_m$ form the plate line signals $PL_0$–$PL_m$ for input to the various cells $14_0$–$14_n$ of the array 12. Only one of the plate line signals $PL_0$–$PL_m$ is active during a memory access.

As previously described, the column decoders 18 are coupled to the various bit lines of the array 12 and are bi-directionally coupled to a shift register 38 by means of a bi-directional bus 40. The shift register 38 provides a single, serial input/output ("I/O") input to the memory device 10 which is coupled back to the input of the shift register 38 by means of I/O line 42. A bi-directional bus 40 interconnects the column address signals between the column decoders 18 and the shift register 38. A bus 44 couples the shift register 38 to an address register 46 which, in turn, is coupled by means of an address bus 48 to the word line decoders 20 and column decoders 18 to access a particular cell $14_0$–$14_n$ of the array 12. The bus 44 also couples the shift register 38 to a control logic 50 which has as an input a single external clocking input ("CLK") to the memory device 10.

The control logic 50 provides a number of control signals at its output for operationally controlling the memory device 10. A chip enable bar ("ceb"), a plate high bar ("plthib") and a column enable ("colen") signals are supplied on lines 56, 58 and 60, respectively, to a plate pulsing logic 52 as shown. In like manner, a pre-write enable ("prewen"), a bit line precharge ("blpc"), and a plate line 3 ("pl3") signals are supplied to a multiple plate pulsing ("mpp") logic 54 on lines 62, 64, and 66, respectively. The mpp logic 54 provides a new plate line 3 ("newpl3") signal on line 68 to the control logic 50 as shown. The mpp logic 54 also provides an extra plate clock bar ("xplclkb") signal on line 78 as one input to NAND gate 80 as shown.

The plate pulsing logic 52 includes an OR gate 70 having as inputs the "plthib" and "colen" signals on lines 58 and 60, respectively. The "plthib" signal is active "low" and indicates when the plate line (via the "dpl" signal) has reached a "high" level for the first time during the normal plate pulsing operation. It is used to return the "plclk" signal back to a "low" level. The "colen" signal is normally "low" until the bit lines are latched to the full potential. Once this occurs, the "colen" signal goes "high" and forces the "plclk" signal "high" for a second time which is the last pulse for the plate line if multiple plate pulsing is not employed. The "ceb" signal is supplied to an inverter 72 for one input to NAND gate 74 having as its other input the output of OR gate 70. The "ceb" signal is normally "high" and it goes "low" to indicate the start of a memory access. When the access is completed and the array 12 is ready to be precharged, "ceb" returns to the "high" state. The output of NAND gate 74 is supplied on line 76 as the other input to NAND gate 80 which has as its output, the signal "plclk" on line 82 for input to the various AND gates 32, $36_0$–$36_m$ of the word line decoders 20.

A dummy plate line ("dpl") signal from the dummy cells $16_0$–$16_n$ of the memory array 12 is supplied as one input to a Schmitt trigger having its output connected to an inverter 88 for supplying a plate line bar bar ("plbb") signal on line 90 for input to mpp logic 54 to provide information concerning the plate line of the selected memory cell 14 of the array 12, which it tracks directly. That is, the "plbb" signal behaves identically to the actual plate signal for any selected row of memory cells 14.

Figure 3A:
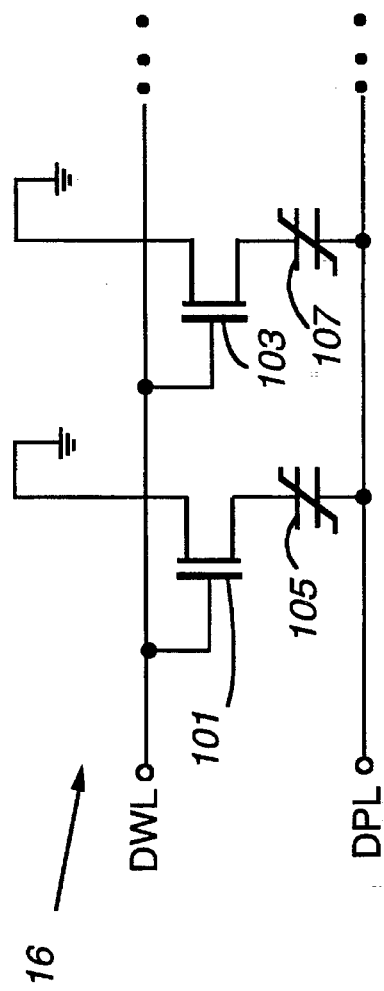
FIG. 3A is a detailed schematic illustration of a dummy memory cell as generally illustrated in the array of FIG. 2 indicating that, unlike the memory cell illustrated in the following FIG. 3B, it has no connection to the complementary bit lines of the array.

With reference additionally now to FIG. 3A, a dummy cell 16 for utilization in conjunction with a conventional 2T/2C memory cell 14 forming a portion of the memory array 12 of FIG. 2 is shown. In the dummy cell 16, complimentary pairs of transistors and ferroelectric capacitors are utilized as with the memory cell 14. Each portion of the dummy cell 16 comprises a pass transistor 101, 103 having one terminal thereof connected to circuit ground and another terminal thereof connected to one terminal of a ferroelectric capacitor 105, 107 respectively. The gate terminals of the respective pass transistors 101, 103 are connected to the dummy word line ("DWL") as shown. The other terminal of the ferroelectric capacitors 105, 107 are connected to the dummy plate line ("DPL").

Figure 3B:
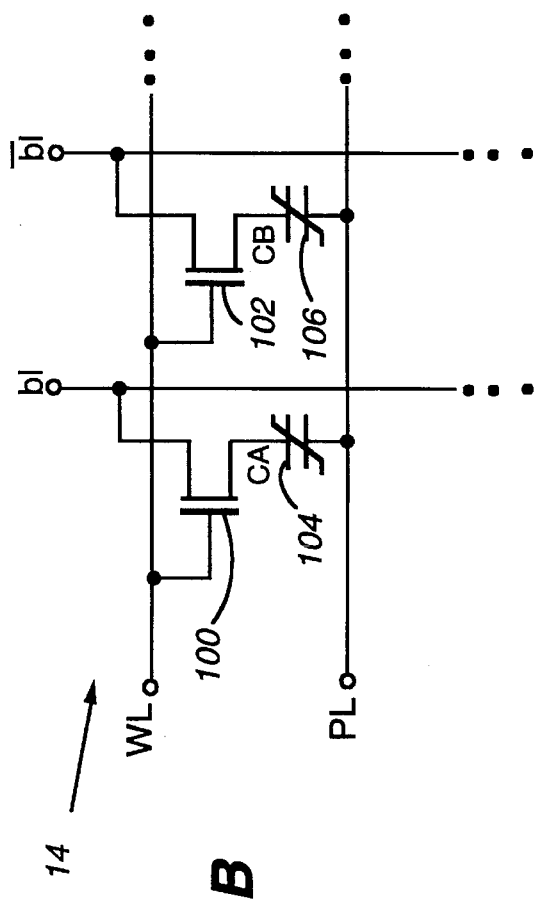
FIG. 3B is a detailed schematic illustration of a prior art two transistor/two capacitor ("2T/2C") memory cell as also illustrated in the array of FIG. 2 for facilitating understanding of the operation of the circuit and method of the present invention in conjunction with the following figures.

With reference additionally now to FIG. 3B, a conventional 2T/2C cell 14 forming a portion of the memory array 12 of FIG. 2 is shown. In a conventional 2T/2C cell 14, complimentary pairs of transistors and ferroelectric capacitors are utilized. Each portion of the cell 14 comprises a pass transistor 100, 102 having one terminal thereof connected to a bit line ("BL") or ("BL\") and another terminal thereof connected to one terminal of a ferroelectric capacitor 104, 106 respectively. The gate terminals of the respective pass transistors 100, 102 are connected to a word line ("WL") as shown. The other terminal of the ferroelectric capacitors 104, 106 comprising, as illustrated, a capacitor $C_A$ and capacitor $C_B$ respectively are connected to a plate line ("PL").

In a 1T/1C memory cell, for example, the cell structure is similar to that of a standard dynamic random access memory ("DRAM") cell utilizing only a single pass transistor (e.g. transistor 100) coupled to a single ferroelectric capacitor (e.g. capacitor 102) with the distinction of a third active line at the capacitor plate. Instead of a differential cell structure like the 2T/2C shown, a single bit line is coupled to one terminal of the transistor and the word line is again coupled to the gate terminal as shown. When reading the contents of a 1T/1C cell, the capacitor (e.g. capacitor 104 or 106) is polarized and the charge transferred is compared to a reference cell or other fixed level and the result of this comparison determines whether a logic "one" or "zero" was stored in the cell.

Figure 4:
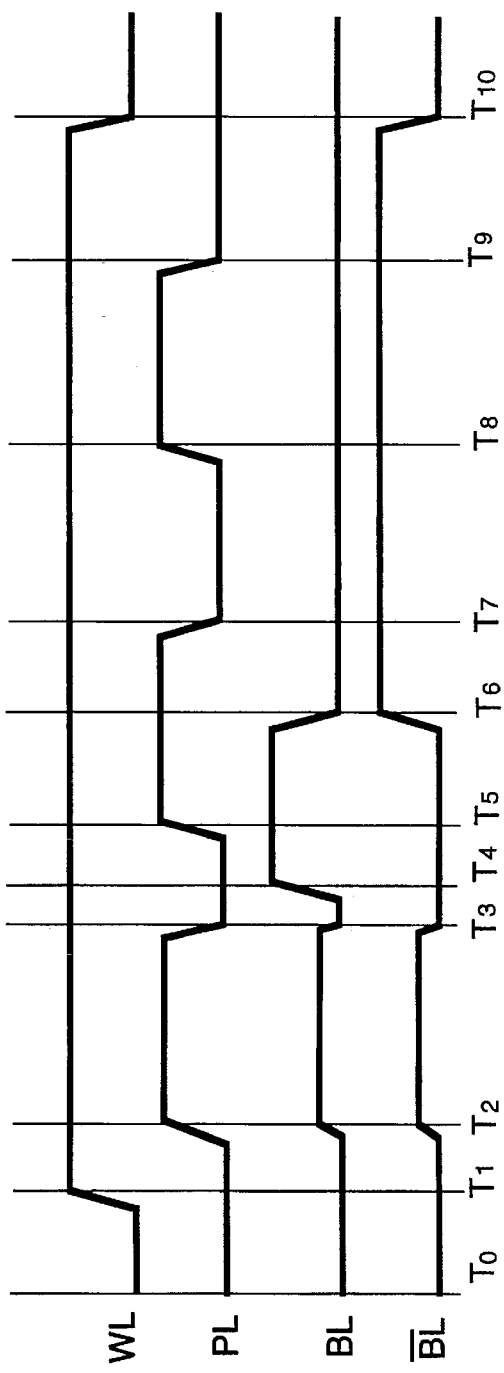
FIG. 4 is a series of representative waveforms illustrative of the signals present on the word line, plate line and complementary bit lines of the 2T/2C memory cell of FIG. 3B.

The illustration of the 2T/2C cell 14 of FIG. 3B is useful in understanding the operation of the circuit and method of the present invention in conjunction with FIG. 4 although it should be noted that the principles of the present invention are likewise applicable to single transistor/single capacitor ("1T/1C") ferroelectric memory devices as well as any ferroelectric memory cells such as 2T/1C or more complicated cells having any possible number of transistors and capacitor combinations (e.g. 12T/4C).

Referring now to FIG. 4 and the following Table 1, the operation of the circuit and method of the present invention may be further understood.

TABLE 1

| Time ($t_x$) | 0 | 1 | 2 | 3 | 4 | 5 | 6 | 7 | 8 | 9 | 10 |
|---|---|---|---|---|---|---|---|---|---|---|---|
| $C_A$ | ↓ | ↓ | ↑ | ↑ | ↓ | ↓ | ↑ | ↑ | ↑$_R$ | ↑ | ↑ |
| $C_B$ | ↑ | ↑ | ↑$_R$ | ↑ | ↑ | ↑$_R$ | ↑ | ↓ | ↓ | ↓$_R$ | ↓$_R$ |
| WL | 0 | 1 | 1 | 1 | 1 | 1 | 1 | 1 | 1 | 1 | 0 |
| PL | 0 | 0 | 1 | 0 | 0 | 1 | 1 | 0 | 1 | 0 | 0 |
| BL | 0 | 0 | 0 | 0 | 1 | 1 | 0 | 0 | 0 | 0 | 0 |
| BL\ | 0 | 0 | 0 | 0 | 0 | 0 | 1 | 1 | 1 | 1 | 0 |

At time $t_0$, the initial conditions are shown with the word line "WL", plate line "PL", bit line "BL" and bit line bar "BL\" lines all at a logic "low" ("0") state with the initial polarization conditions of the capacitor $C_A$ holding a logic "1" and capacitor $C_B$ holding a logic "0". The polarization conditions are indicated in Table 1 as a dipole in capacitor $C_A$ pointed downwards while the dipole in capacitor $C_B$ points upwards.

At time $t_1$, the word line "WL" goes "high" ("1") and, thereafter, at time $t_2$, the plate line "PL" also transitions to a logic "high" state which inverts the dipoles on capacitor $C_A$ to read out the logic "1". This is a destructive "read" operation. At the same time, the same dipole state is reinforced on capacitor $C_B$ as indicated by the "R" in Table 1.

At time $t_3$, the signal on plate line "PL" transitions to a "low" state which subtracts the linear charge from both bit lines "BL" and "BL\".

Thereafter, at time $t_4$, the sense amplifiers 22 latch, driving the bit line "BL" to a logic "high" state and bit line "BL\" to a logic "low" state. The dipoles of capacitor $C_A$ flip once again to restore the original state.

At time $t_5$, the plate line "PL" transitions "high" for a second time thereby reinforcing the polarization condition within capacitor $C_B$.

At time $t_6$, a write of opposite data occurs. At this time, bit line "BL" now transitions to a "low" state while bit line "BL\" goes "high". The dipoles within capacitor $C_A$ are flipped to reflect this new state.

At time $t_7$, the plate line "PL" goes "low" and the dipoles of capacitor $C_B$ now flip to reflect the new state. In a conventional ferroelectric memory device, this is where the plate pulsing operation during a "write" terminates. At this point, capacitor $C_A$ has only experienced one reversal to the new state. Capacitor $C_B$ has also seen only one reversal, but since the electrodes are not returned to a logic "low" state, the charge on the top electrode of the capacitor effectively reinforces the new state on capacitor $C_B$ for a few milliseconds, until the charge leaks away.

At time $t_8$, the new plate line "PL" pulsing scheme of the present invention takes place wherein plate line "PL" is transitioned "high" once again. The dipoles on capacitor $C_A$ are now reinforced for the new state.

At time $t_9$, the plate line "PL" is taken "low" again, also reinforcing the dipoles in capacitor $C_B$. With particular reference to the multiple plate line "PL" pulsing scheme shown in FIG. 4, it should be clearly understood that while only an additional transition of the plate line "PL" is shown, the operations occurring at time $t_8$–$t_9$ may be repeated any number of times to reinforce the dipoles on capacitor $C_A$.

Upon completing the operation at time $t_{10}$, the bit lines "BL" and "BL\" are precharged back to a logic "low" state and the word line "WL" may also be returned to a logic "low" state.

Figure 5:
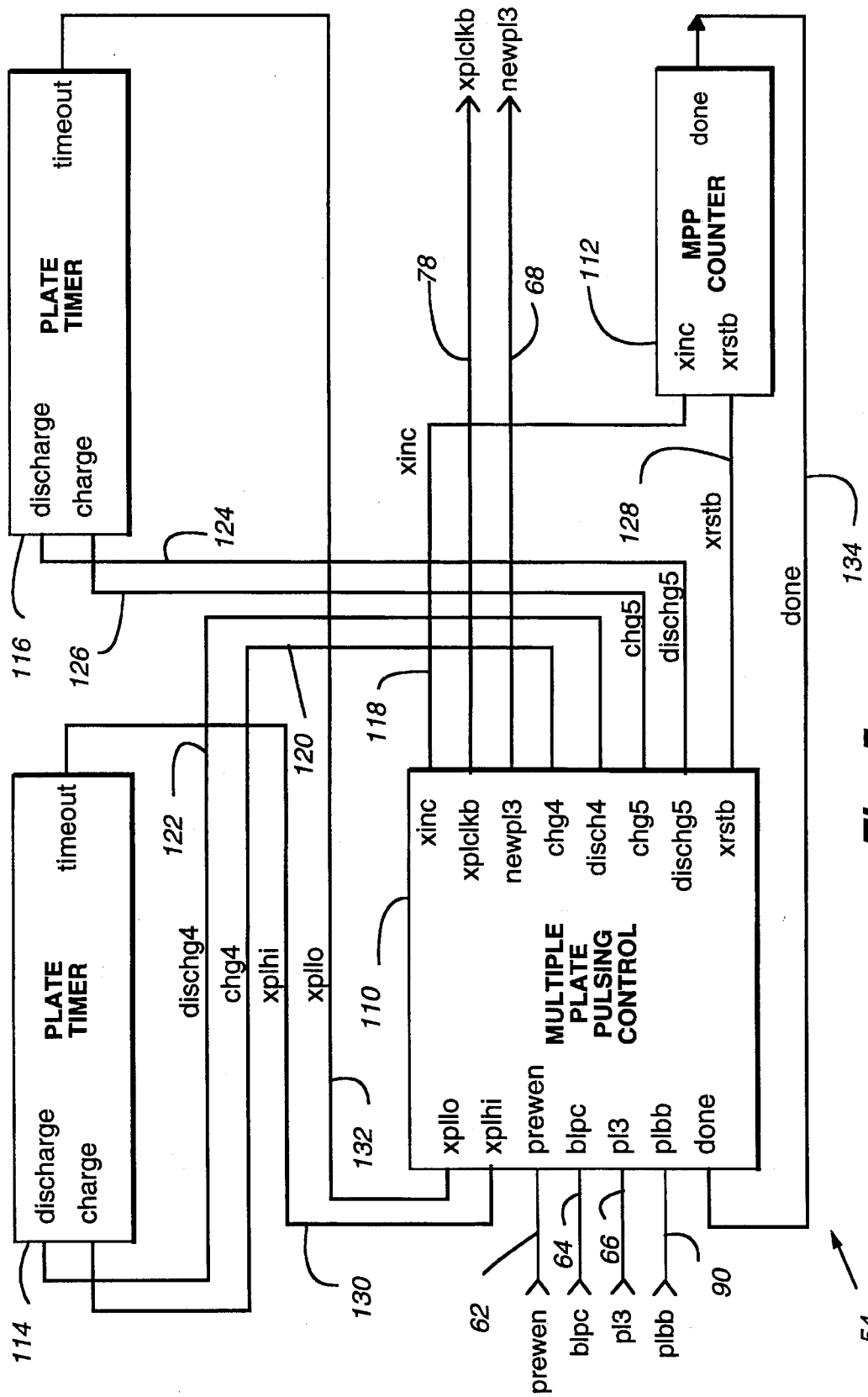
FIG. 5 is a more detailed functional logic block diagram of the multiple plate pulsing "MPP" logic shown in FIG. 2 illustrating the various input signals received from the memory device control logic and the interrelationship among the MPP control, MPP counter and plate timer logic blocks.

Referring additionally now to FIG. 5, further details of the Multiple Plate Pulsing ("MPP") logic 54 of the memory device 10 are shown. The MPP logic 54 comprises, in pertinent part, an MPP control ("mppctl") 110, an MPP counter ("mppctr") 112, and a pair of plate timers 114, 116. The MPP counter 112 allows, in the implementation hereinafter described, 1 through 8 additional pulses of the plate line "PL" to be introduced. The plate timer 114 sets the width of the additional pulse while the plate timer 116 sets the time between the pulses of the plate line "PL".

Figure 1:
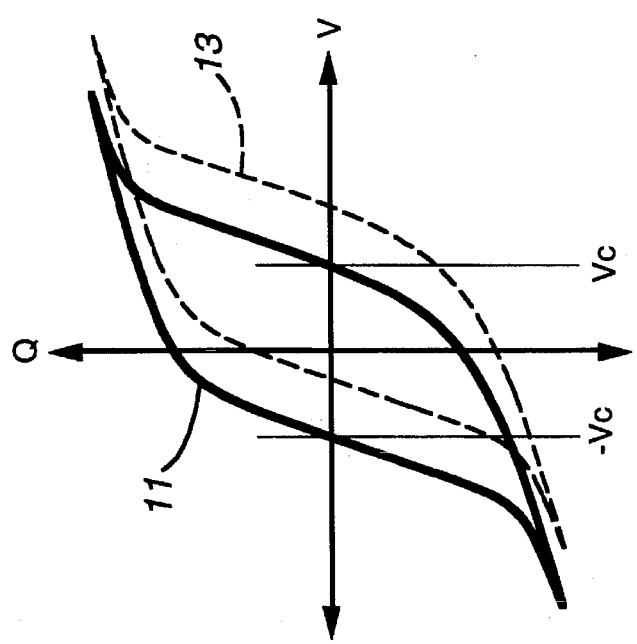
FIG. 1 is a graphic representation of the hysteresis curve previously described wherein the abscissa represents the applied voltage ("V") and the ordinate represents the resulting polarization state ("Q") for an uncompensated (solid line) and compensated (dashed line) ferroelectric capacitor.

As shown, the MPP control 110 receives a "prewen" signal on line 62 from the control logic 50 (FIG. 1) which indicates a "write" cycle is being performed in the memory device 10. The "prewen" signal is also used by the MPP logic 54 to indicate multiple pulses will be needed for this operation. It should be noted that multiple plate pulsing technique herein described is not used for "read" operations but only for "writes". The MPP control 110 also receives a "blpc" signal on blpc line 64. This signal is utilized by the MPP logic 54 to reset all logic to indicate the memory access is completed in its entirety, including the precharged phase. The "p13" signal on p13 line 66 indicates the normal plate pulsing sequence (of 2 pulses) is complete. Upon activation of the "p13" signal, the MPP logic 54 will commence operations and take control of the "plclk" signal on plclk line 82 input to the word line decoders 20 (FIG. 2). A "plbb" signal on plbb line 90 tracks the plate line "PL" via the dummy plate line "dpl". The "plbb" signal is utilized to provide timing information to the MPP logic 54 such that the "plclk" signal can be pulsed up and down at the appropriate time. The "plbb" signal also provides a means for charging up both plate timers 114, 116 in the MPP logic 54 for their first cycle.

The MPP control 110 provides an increment signal "xinc" on xinc line 118 to inform the MPP counter 112 that it needs to increment its count by one. The signal "xinc" activates with each rising edge of the signal "dischg4" on dischg4 line 122 also output from the MPP control 110.

The MPP control 110 also provides the "xplclkb" signal on xplclkb line 78 for input to the NAND gate 80 (FIG. 2). Additionally, the MPP control 110 also provides the "newp13" signal on newp13 line 68 for input to the control logic 50 (FIG. 2). The "xplclkb" signal is active "low" and is utilized to directly control the signal "plclk" for the additional plate line "PL" pulses. The logic utilized to effectuate this function is shown in FIG. 2. The signal "newp13" is generated by the MPP logic 54 to indicate when the additional plate pulsing is finished executing. When the "newp13" signal activates, the control logic completes the precharge phase, thereby returning all signals back to their precharged state.

The multiple plate pulsing control 110 also provides a "chg4" signal on chg4 line 120. The "chg4" signal charges up the plate timer 114 which controls the width of the "ON" portion of the pulse during multiple plate line "PL" pulsing operations. The "chg4" signal is active when the opposite plate timer 116 is discharging. The "dischg4" signal on dischg4 line 122 output from the MPP control 110 discharges the plate timer 114. As previously noted, the plate timer 114 controls the width of the "ON" portion of the pulse during multiple plate pulsing operations. The "dischg4" signal is active when the plate timer 116 is charging.

Conversely, the MPP control 110 supplies a "chg5" signal on chg5 line 126 for input to the plate timer 116. The "chg5" signal charges up plate timer 116 which controls the width of the "OFF" portion of the pulse during multiple plate line "PL" pulsing operations. The "chg5" signal is active when the plate timer 114 is discharging. In like manner, the MPP control 110 supplies a "dischg5" signal on dischg5 line 124 for input to the plate timer 116. The "dischg5" signal discharges the plate timer 116 during multiple plate pulsing operations. The "dischg5" is active when the plate timer 114 is charging.

The MPP control 110 also supplies the "xrstb" signal on xrstb line 128 for input to the MPP counter 112. The "xrstb" signal is the reset signal for the MPP counter 112 which is generated by the MPP control 110. The "xrstb" signal is active "low" and is normally asserted. It is only turned "OFF" during multiple plate pulsing operations and, normally, the signal "xrstb" keeps the MPP counter 112 reset.

The MPP counter 112 supplies a "done" signal on done line 134 to the MPP control 110. The "done" signal is generated by the MPP counter 112 and activates when the desired number of pulses have been generated. When the MPP control 110 receives this signal, it completes the last plate pulse cycle and shuts down its operations. The plate timers 114, 116 both provide a "timeout" signal to the MPP control 110 on xplhi line 130 and xpllo line 132 respectively. The "xplhi" signal is the "timeout" signal generated by the plate timer 114 which times the width of the "ON" portion of the pulse. It indicates that the plate line "PL" has been "high" long enough so that the "low" portion of the pulse can now begin. Conversely, the "xpllo" signal from plate timer 116 is the "timeout" signal generated which times the width of the "OFF" portion of the pulse. The signal "xpllo" indicates when the plate line "PL" has been "low" long enough so that the "high" portion of the pulse can now begin.

Figure 6:
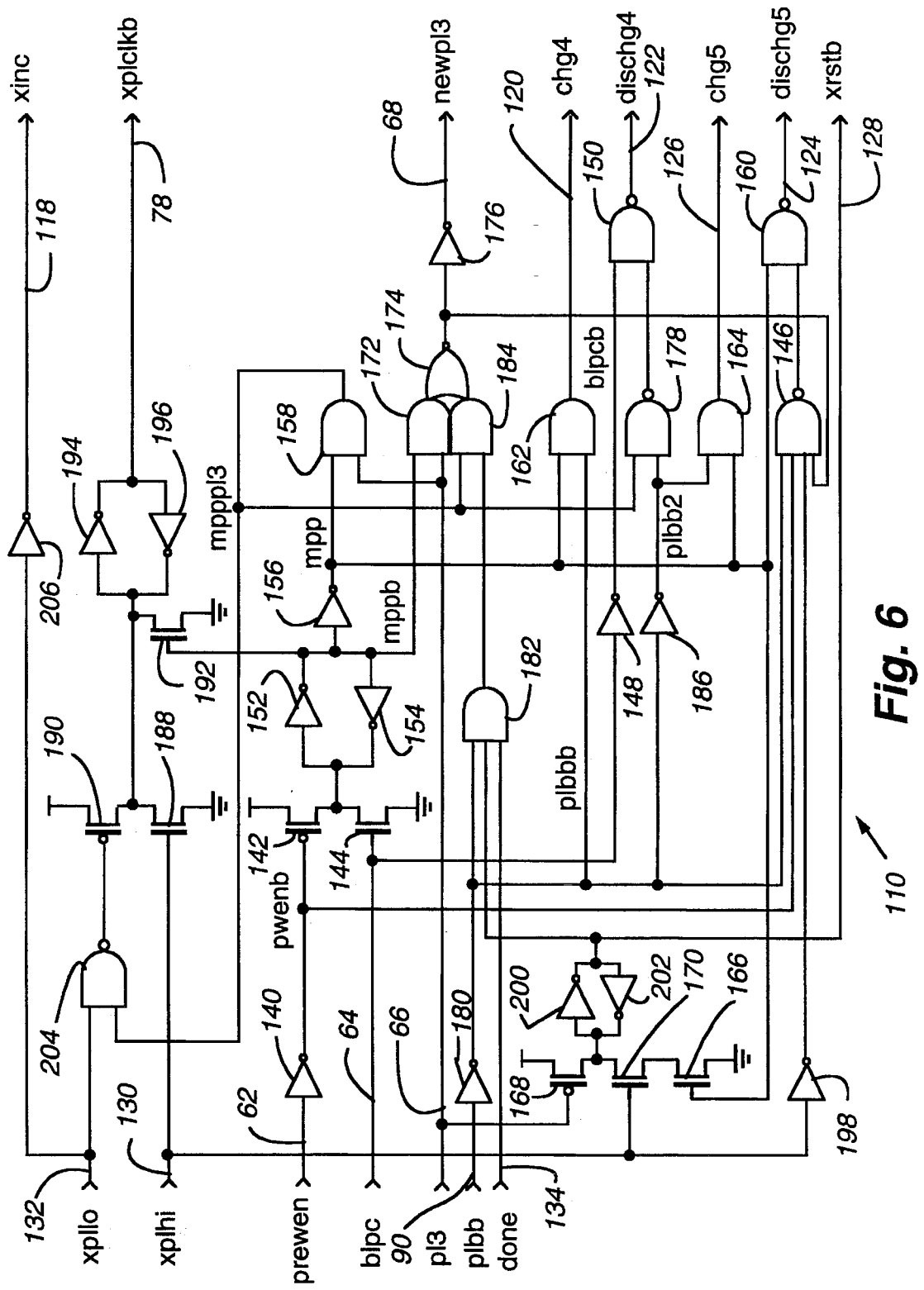
FIG. 6 is a detailed schematic illustration of the MPP control logic of FIG. 5 showing the various input and output signals thereof.

With reference additionally now to FIG. 6, a more detailed view of the MPP control 110 is shown. In the ensuing description, like structure and signals described with respect to the preceding figures are like numbered and the foregoing description thereof shall suffice herefor.

Prewen line 62 is coupled through an inverter 140 to the gate of a P channel transistor 142 connected in series with an N channel transistor 144 between a source of supply voltage and circuit ground. The signal at the gate of the P channel transistor 142 is designated "pwenb". Blpc line 64 is connected to the gate of transistor 144 and coupled through an inverter 148 to be supplied as one input to NAND gate 150. The output of inverter 148 is the signal "blpcb". The output of NAND gate 150 is furnished on dischg4 line 122.

The signal on the node intermediate transistor 142 and transistor 144 is supplied as input to inverter 152 having a parallel connected inverter 154 together forming a latch to provide a signal "mppb". The output of inverter 152 is connected to inverter 156 to provide the signal "mpp" forming one input to AND gate 158. The output of inverter 156 is supplied as one input to NAND gate 160 which has its output on dischg5 line 124. The "mpp" signal at the output of inverter 156 is also supplied as an input to AND gate 162 having its output on chg4 line 120. The "mpp" signal is also supplied as one input to AND gate 164 having its output on chg5 line 126. Finally, the output of inverter 156 comprising the signal "mpp" is supplied to the gate of N channel transistor 166 connected in series with P channel transistor 168 and N channel transistor 170 connected between a source of supply voltage and circuit ground.

The output of the latch comprising inverters 152, 154 is supplied as one input to AND gate 172 having its output connected as one input to NOR gate 174 which, in turn, supplies a signal through inverter 176 to newp13 line 68. The output of NOR gate 174 is also supplied as one input to NAND gate 146 having its output connected as the remaining input to NAND gate 160.

The signal on p13 line 66 is connected as an additional input to AND gate 158 and AND gate 172 as shown. Additionally, the signal on p13 line 66 is connected to the gate of transistor 168. The signal on plbb line 90 is coupled through an inverter 180 to form one input to three input AND gate 182 which has its output as one input to AND gate 184. The output of AND gate 184 is supplied as the remaining input to NOR gate 174. Additionally, the output of inverter 180 is supplied as a "plbbb" signal as an additional input to AND gate 162. Moreover, the same signal is supplied as an additional input to NAND gate 146. The "plbbb" signal is also inverted through inverter 186 to form a "plbb2" signal forming one input to NAND gate 178 and an additional input to AND gate 164. The output of NAND gate 178 is supplied as a remaining input to NAND gate 150.

The "done" signal on done line 134 is supplied as an additional input to AND gate 182 as shown. Xplhi line 130 is connected to the gate of N channel transistor 188 connected in series with P channel transistor 190 between a source of supply voltage and circuit ground. The "xplhi" signal is also supplied as an input to inverter 198 for application as an additional input to NAND gate 146. The remaining input to NAND gate 146 is also taken at the output of inverter 140 comprising the signal "pwenb". Additionally, xplhi line 130 is connected to the gate of transistor 170. The node intermediate transistors 168 and 170 is coupled to a latch comprising the parallel combination of inverters 200 and 202 which, in turn, are connected as a remaining input to AND gate 182 on xrstb line 128.

Xpllo line 132 is connected as one input to NAND gate 204 as well as to invertor 206 to produce the "xinc" signal on xinc line 118. The output of NAND gate 204 is coupled to the gate of transistor 190. The node intermediate transistors 188 and 190 is coupled through a latch comprising the parallel combination of inverters 194 and 196 to xplclkb line 78. The remaining input to NAND gate 204 and NAND gate 184 is taken at the output of AND gate 158 as shown comprising the signal "mppp13". The signal "mppp13" is also supplied as the remaining input to NAND gate 178. A transistor 192 couples the node intermediate transistors 188 and 190 to circuit ground and has its gate connected to the output of the latch comprising inverters 152, 154 providing the signal "mppb".

Figure 7:
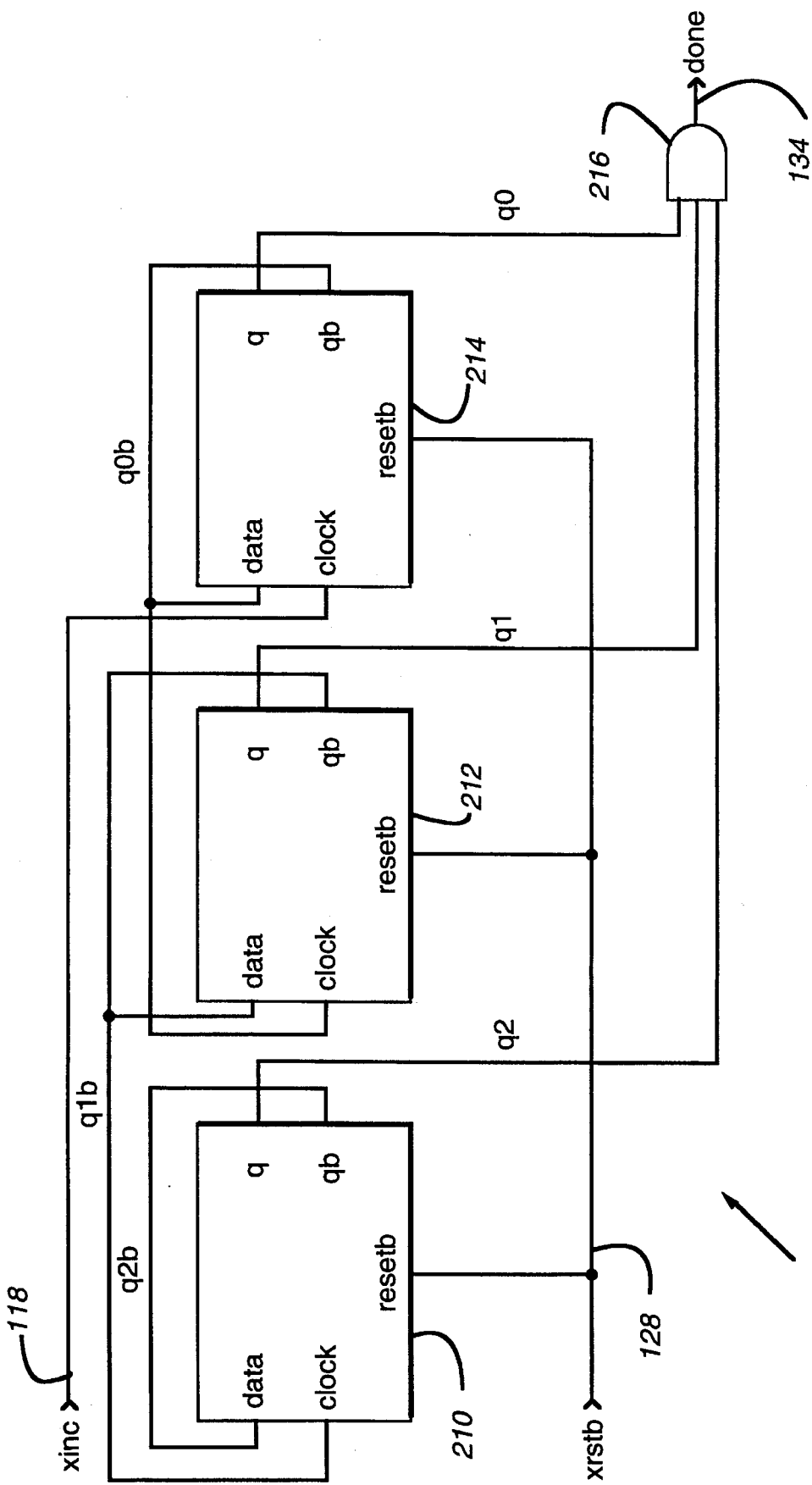
FIG. 7 is a detailed schematic illustration of the MPP counter of FIG. 5 showing the various input signals received from the MPP control logic and the programmable output signal produced in response thereto.

With reference additionally now to FIG. 7, the mpp counter 112 is shown in greater detail. The mpp counter 112 comprises, in pertinent part, a number of "D" type flip flops 210, 212, and 214. The flip flops 210, 212, and 214 have their reset bar ("resetb") inputs connected to xrstb line 128. Input to the mpp counter 112 is supplied on xinc line 118 to the "clock" input of flip flop 214 which, in turn, has its "data" and "q bar" ("qb") terminals connected to the "clock" input of flip flop 212 comprising a signal "q0b". The "q" output of flip flop 214 comprising the signal "q0" is supplied as one input to three input AND gate 216 having its output connected to done line 134. In turn, flip flop 212 has its "data" and "qb" terminals coupled together to the "clock" input of flip flop 210 comprising the signal "q1b". The "q" output of flip flop 212 comprising the signal "q1" is supplied as an additional input to AND gate 216. Finally, flip flop 210 has its "data" and "qb" inputs coupled together on which the signal "q2b" is formed. The "q" output of flip flop 212 comprising the signal "q2" forms the final input to AND gate 216. The q0, q1 and q2 inputs to AND gate 216 are metal-mask programmable with the q0b, q1b and q2b outputs of the flip flops 210, 212 and 214 to supply between 1–8 additional plate line "PL" pulses in accordance with the multiple plate pulsing circuit and method of the present invention.

Figure 8:
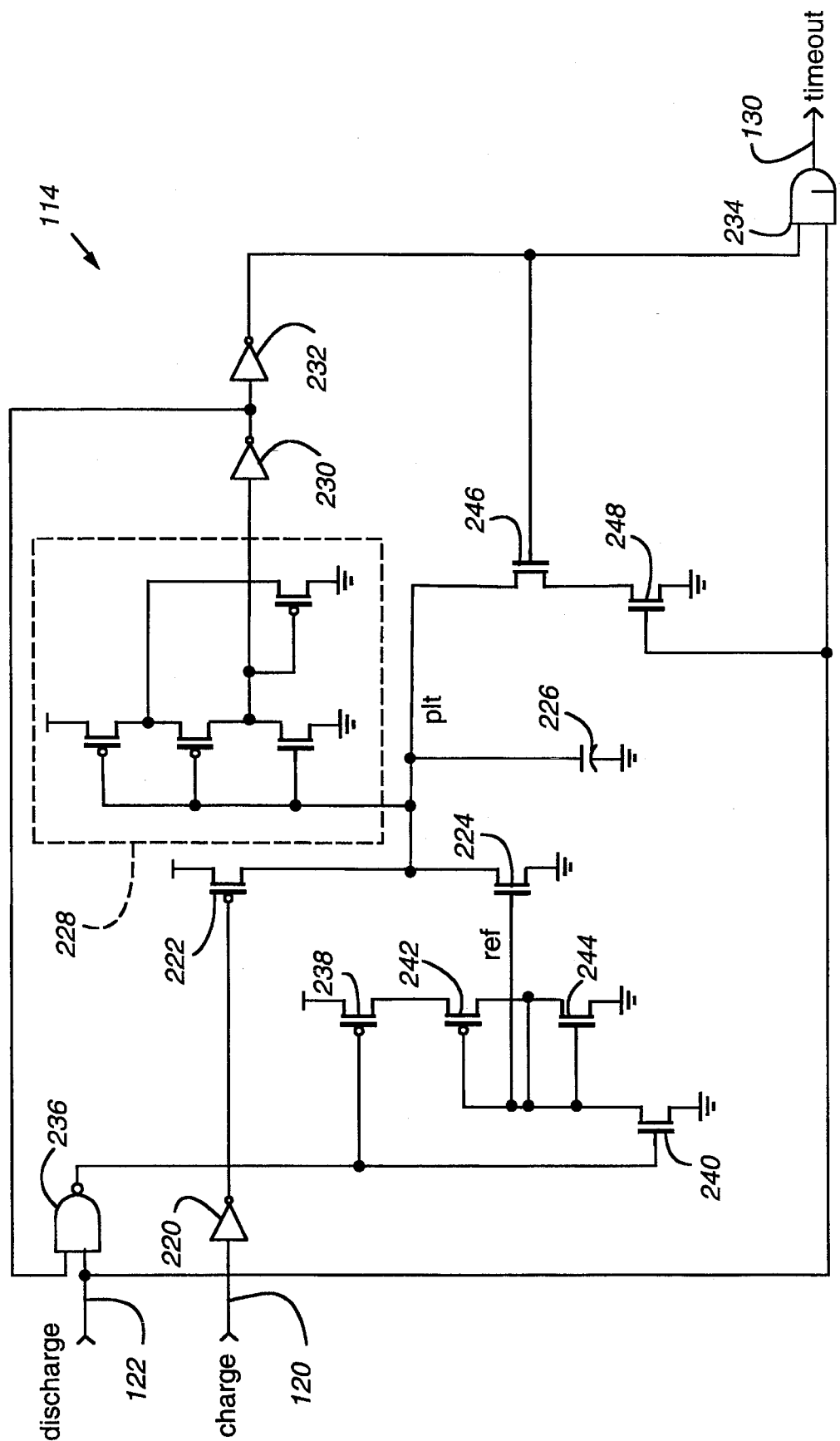
FIG. 8 is a detailed schematic illustration of a representative one of the plate timer logic blocks of the MPP logic of FIG. 5 showing the input and output signals thereof.

Referring additionally now to FIG. 8, the plate timer 114 is shown in greater detail. While the description with respect to FIG. 8 will be made with respect to plate timer 114, the structure and function of plate timer 116 is analogous and the ensuing description of the circuitry with respect to the plate timer 114 shall suffice therefor. A "charge" signal, for example on chg4 line 120, is supplied as an input to the plate timer 114 for application through inverter 220 to the gate of a P channel transistor 222 connected in series with an N channel transistor 224 between a source of supply voltage and circuit ground. The node intermediate transistors 222 and 224 is coupled to circuit ground through a capacitor 226 and also to the input of a Schmitt trigger 228 comprising a number of transistors as shown. The output of the node intermediate transistors 222 and 224 comprising the signal "plt" is also supplied to one terminal of N channel transistor 246 connected in series with N channel transistor 248 to circuit ground.

The output of Schmitt trigger 228 is inverted by means of inverter 230 and supplied as one input to NAND gate 236 having its other input connected to a "discharge" signal, for example, the signal on dischg4 line 122. The output of inverter 230 is supplied through inverter 232 to the gate terminal of transistor 246 as well as to one input of AND gate 234 having its output connected to provide a "timeout"

signal, for example, on xplhi line 130. The "discharge" signal input to NAND gate 236 is also supplied as an input to AND gate 234 as well as to the gate terminal of transistor 248.

The output of NAND gate 236 is supplied as an input to the gate terminal of P channel transistor 238 connected in series with P channel transistor 242 and N channel transistor 244 between a source of supply voltage and circuit ground. The node intermediate transistors 242 and 244 is connected to the gate terminal of transistor 224 and supplies a reference ("ref") signal thereto. The gate terminals of transistors 242 and 244 are also connected to the gate of transistor 224 as well as to one terminal of N Channel transistor 240 having its opposite terminal connected to circuit ground. The gate terminal of transistor 240 is also connected to the output of NAND gate 236.

Figure 9A:
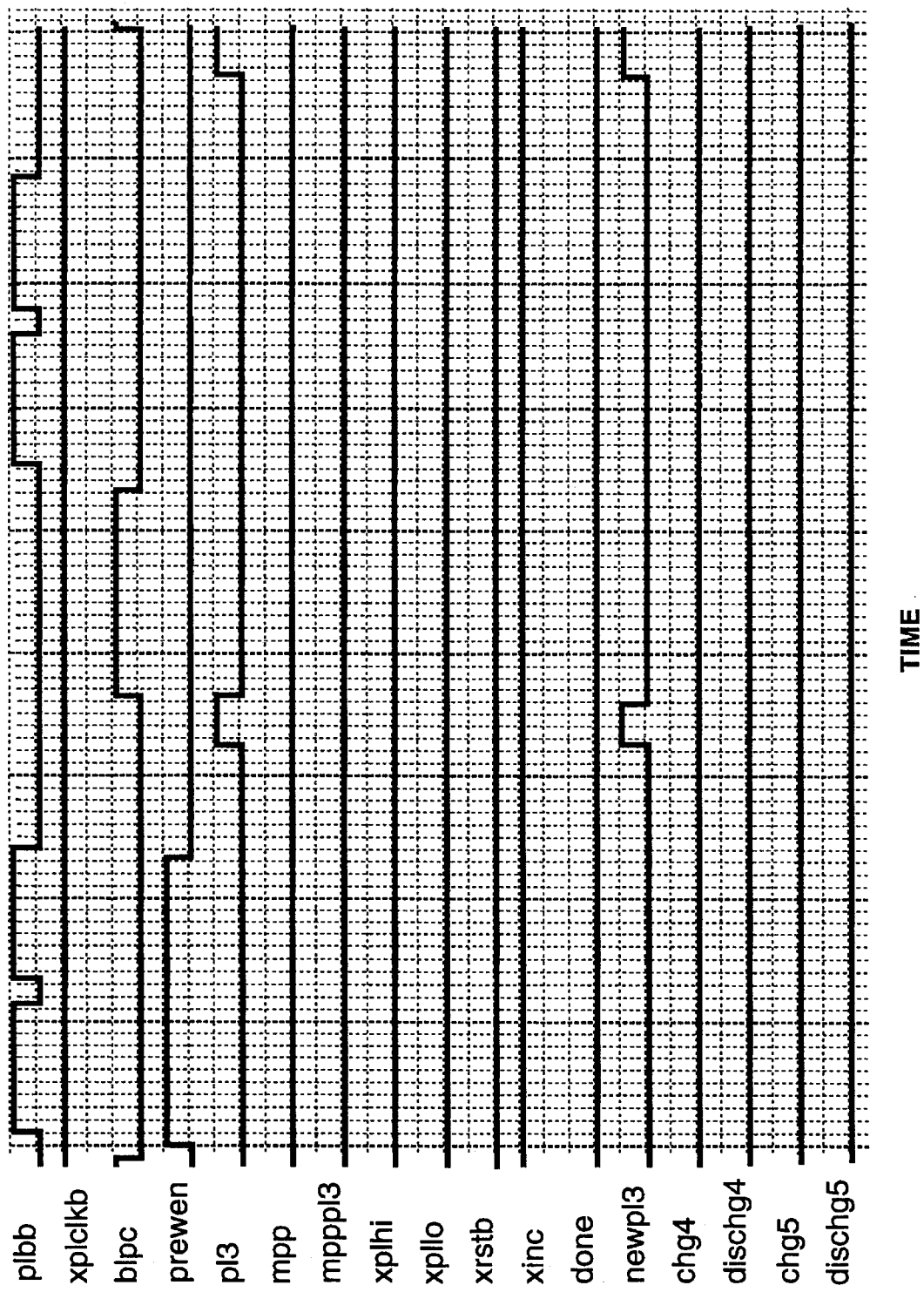
FIGS. 9A, 9B and 9C are representative waveforms illustrative of the signals on selected signal lines during a standard "write" and "read" operation of a ferroelectric memory device, a "write" incorporating two plate line pulses followed by a "read" and a "write" incorporating eight plate line pulses followed by a "read" respectively.

Referring additionally now to FIG. 9A, in conjunction with FIG. 6 in particular, the corresponding representative wave-forms of the various signals noted in FIG. 6 are shown in conjunction with a conventional "write" and "read" operation. In conjunction with the wave-forms of FIG. 9A, it can be seen that no additional plate line "PL" pulses are utilized to reinforce the dipoles in one of the capacitors of the 2T/2C cell 14.

Figure 9B:
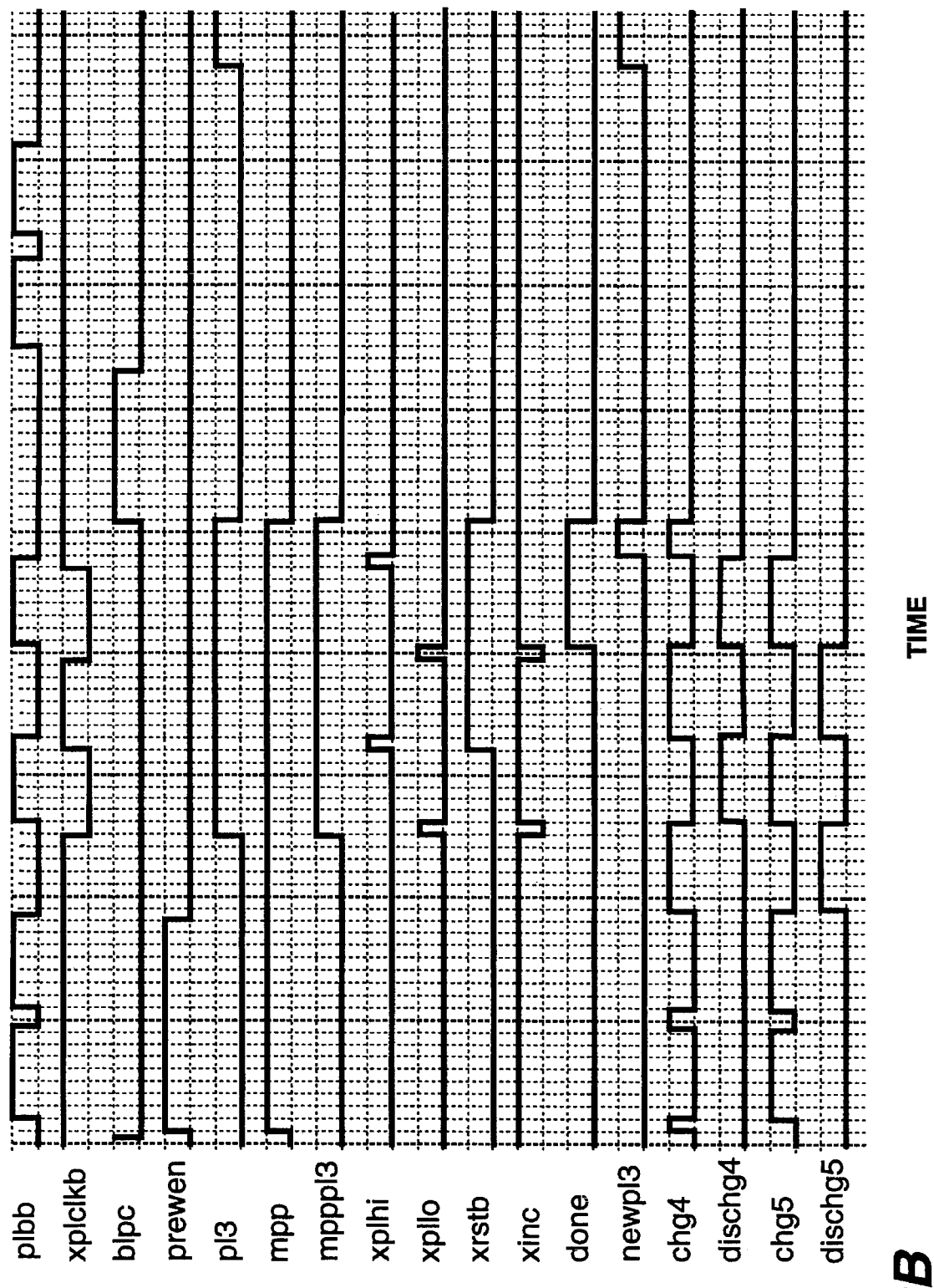

Referring additionally now to FIG. 9B, it can be seen that the signal "plbb" incorporates two extra plate line "PL" pulses in accordance with the multiple plate pulsing circuit and method of the present invention by programming the additional two pulses in the mpp counter 112 (FIG. 5).

Figure 9C:
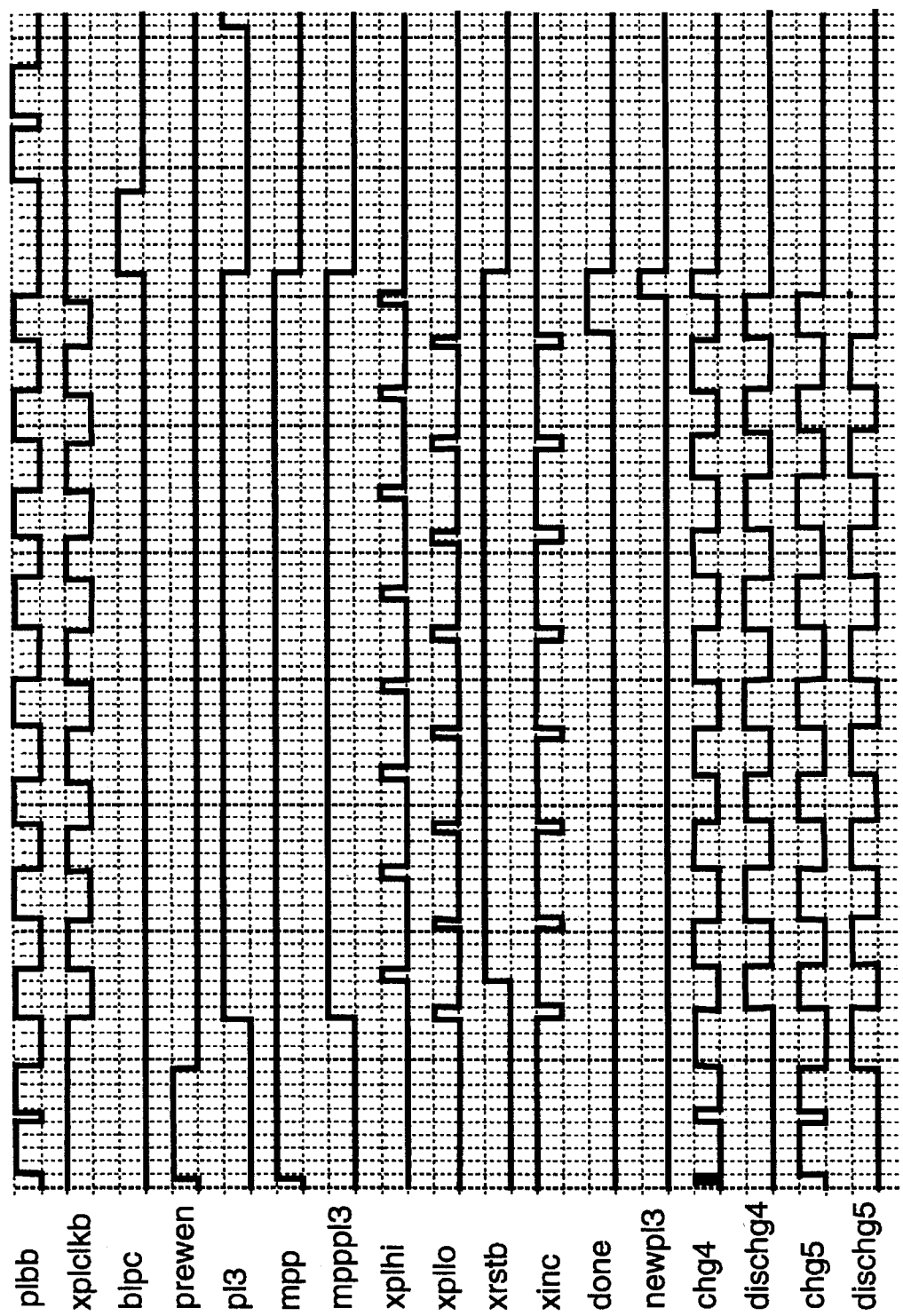

Referring additionally now to FIG. 9C the circuit and method of the present invention is seen in operation in conjunction with eight extra plate line "PL" pulses as seen particularly with respect to the signal "plbb". As with the wave forms illustrated in FIG. 9B, the width of the additional pulses is set by the plate timer 114 while the time between the additional pulses is set by the plate timer 116 shown in FIG. 5.

While there have been described above, the principles of the present invention with respect to particular circuitry and embodiments, it should be noted that the foregoing description is made only by way of example and not as a limitation to the scope of the invention as defined by the appended claims. Particularly the multiple plate pulsing technique herein disclosed is applicable to ferroelectric memory devices incorporating 1T/1C memory cells or any other memory cell configuration including at least one ferroelectric capacitor and any number of additional plate line pulses may be utilized to reinforce the dipoles in the memory cell capacitor. It should also be noted that the pulse width of the additional pulses may be varied as required in addition to the timing between pulses without departing from the spirit and scope of the present invention.

What is claimed is:

1. A process for writing data to a ferroelectric memory cell comprising at least one ferroelectric capacitor having a predetermined stored dipole state maintained therein and a series connected transistor selectively coupled between a plate line and a bit line in response to a word line coupled to a control terminal of said transistor, said process comprising the steps of:

firstly applying a potential to said word line to enable said transistor;

secondly applying a first potential to said plate line to place an opposite stored dipole state in said capacitor;

thirdly removing said first potential from said plate line;

fourthly applying a potential to said bit line to return said opposite stored dipole state to said predetermined stored dipole state in said capacitor;

fifthly reapplying said first potential to said plate line;

sixthly removing said potential from said bit line to again place said opposite stored dipole state in said capacitor;

seventhly removing said first potential from said plate line;

eighthly again reapplying said first potential to said plate line;

ninthly again removing said first potential from said plate line; and tenthly returning said bit line and said word line to an initial condition thereof.

2. The process of claim 1 wherein said steps of eighthly again reapplying and ninthly again removing said first potential are iteratively repeated for a predetermined number of times prior to said step of tenthly returning.

3. The process of claim 2 wherein said predetermined number is less than or equal to eight.

4. The process of claim 1 wherein said step of eighthly again reapplying said first potential occurs for substantially between 25–300 nsec.

5. The process of claim 1 wherein said step of ninthly again removing said first potential occurs for substantially between 25–300 nsec.

6. A method of writing data to a ferroelectric memory cell including at least one ferroelectric capacitor having a predetermined stored dipole representing a data state of the memory cell, the method comprising the steps of:

(a) applying a potential of a predetermined polarity and magnitude across the ferroelectric capacitor to place an opposite stored dipole in the capacitor representing an opposite data state of the memory cell;

(b) removing the potential across the ferroelectric capacitor;

(c) reapplying the potential of the same polarity and magnitude across the ferroelectric capacitor; and (d) repeating steps (b) and (c) for a predetermined number of times.

7. The method of claim 6 in which the predetermined number is less than or equal to eight.

8. The method of claim 6 in which the potential across the ferroelectric capacitor in step (b) is removed for a time period between about 25 and 300 nsec.

9. The method of claim 6 in which the potential across the ferroelectric capacitor in step (c) is reapplied for a time period between about 25 and 300 nsec.

* * * * *